United States Patent [19]

Ogawa et al.

[11] Patent Number: 4,563,414

[45] Date of Patent: Jan. 7, 1986

[54] METHOD OF PRODUCING A MASK TO BE USED FOR THE PRODUCTION OF A CERAMIC FILTER

[75] Inventors: Yutaka Ogawa; Shoji Asai, both of Nagoya; Masashi Otaka, Mie, all of Japan

[73] Assignee: NGK Insulators, Ltd., Japan

[21] Appl. No.: 543,119

[22] Filed: Oct. 18, 1983

[30] Foreign Application Priority Data

Mar. 25, 1983 [JP] Japan .................................. 58-48946

[51] Int. Cl.[4] ........................... G03C 5/00; B32B 3/12

[52] U.S. Cl. ....................................... 430/325; 430/11; 430/18; 430/324; 430/331; 428/117; 428/137; 428/188

[58] Field of Search ................. 430/271, 273, 281, 11, 430/9, 18, 308, 315, 325, 324; 428/117, 137, 188

[56] References Cited

U.S. PATENT DOCUMENTS

| | | | |
|---|---|---|---|
| 4,041,591 | 8/1977 | Noll et al. | 29/157.3 R |
| 4,041,592 | 8/1977 | Kelm | 29/157.3 R |
| 4,276,071 | 6/1981 | Outland | 55/523 |
| 4,293,357 | 10/1981 | Higuchi et al. | 156/89 |
| 4,297,140 | 10/1981 | Paisley | 428/310 |
| 4,310,615 | 1/1982 | Steelman et al. | 430/271 |
| 4,362,806 | 12/1982 | Whitmore | 430/202 |
| 4,364,760 | 12/1982 | Higuchi et al. | 55/523 |
| 4,403,008 | 9/1983 | Factor | 428/117 |
| 4,404,007 | 9/1983 | Tukao et al. | 55/523 |
| 4,411,856 | 10/1983 | Montierth | 264/267 |
| 4,427,728 | 1/1984 | Belmonte et al. | 428/117 |

FOREIGN PATENT DOCUMENTS

| | | |
|---|---|---|
| 0070671 | 1/1983 | European Pat. Off. . |
| 0070202 | 1/1983 | European Pat. Off. . |

*Primary Examiner*—John E. Kittle
*Assistant Examiner*—José G. Dees
*Attorney, Agent, or Firm*—Parkhurst & Oliff

[57] ABSTRACT

A method of producing a mask to be used for the production of a ceramic filter is disclosed, wherein an ultraviolet ray-transmitting film, which cannot transmit ultraviolet ray at the portion corresponding to the through holes of a porous ceramic honeycomb structural body, into which holes a sealing material is to be injected at the opening end surface of the body, and can transmit ultraviolet ray at the portion corresponding to the through holes of the body, into which holes the sealing material is not to be injected at the opening end surface of the body, is made; the film is arranged on an ultraviolet ray-curable resin; ultraviolet ray is irradiated to the resin through the film; and the ultraviolet ray-uncured resin portion is removed from the resin. The mask matches to the porous honeycomb structural body, and a ceramic filter can be easily produced from the body.

20 Claims, 11 Drawing Figures

5

6

6

FIG_1
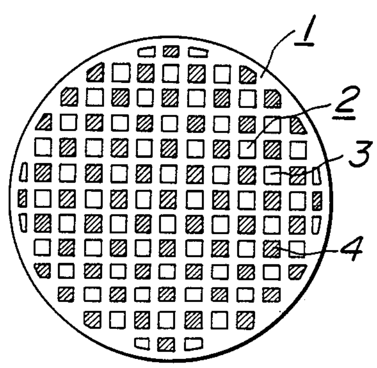
FIG_2
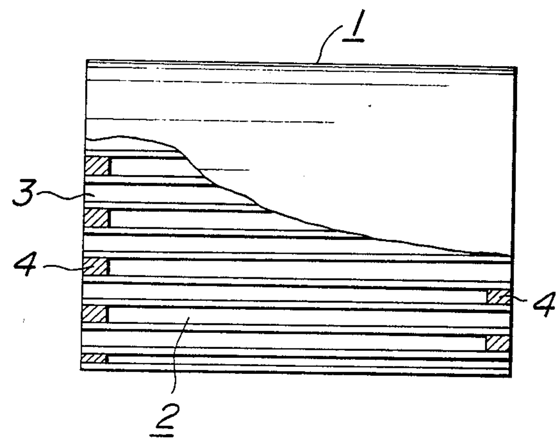
FIG_3
PRIOR ART
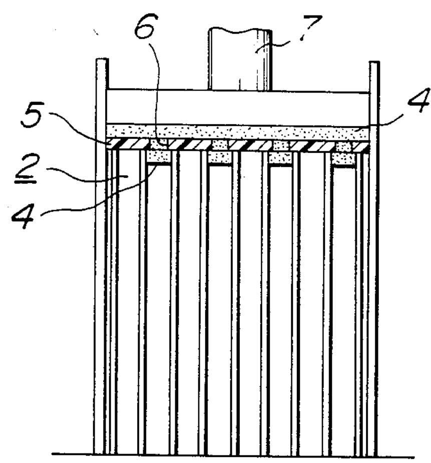
FIG_4
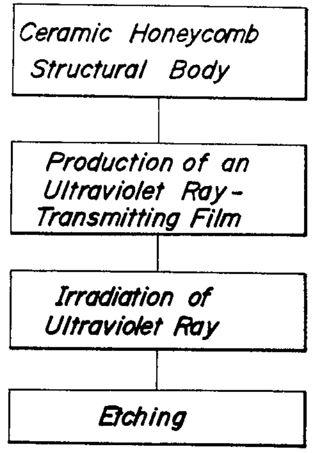

METHOD OF PRODUCING A MASK TO BE USED FOR THE PRODUCTION OF A CERAMIC FILTER

BACKGROUND OF THE INVENTION (1) Field of the Invention

The present invention relates to a method of producing a mask to be used for the production of a ceramic filter from a porous ceramic honeycomb structural body.

(2) Description of the Prior Art

In order to purify exhaust gases of internal engines of automobiles, there has been proposed a ceramic filter 1, which is produced by sealing selected through holes of a porous ceramic honeycomb structural body 2 having a large number of through holes 3 with a sealing material 4 at one end surface of the body and sealing remaining through holes, which are not sealed at one end surface of the body, with the sealing material 4 at the other end surface thereof as illustrated in FIGS. 1 and 2.

Methods of producing such ceramic filter are disclosed in U.S. Pat. No. 4,293,357 and EP No. 70,202A. That is, the prior art, as illustrated in FIG. 3, seals through holes at one end surface of a porous ceramic honeycomb structural body 2 having a large number of through holes and to seals remaining through holes at the other end surface thereof, by using a mask 5, having through holes 6 corresponding to given through holes to be sealed in the porous ceramic honeycomb structural body 2, arranged on the opening end surface of the ceramic honeycomb structural body 2, and injecting a sealing material 4 into the given through holes of the honeycomb structural body through the through holes 6 of the mask 5 by means of a pressuring piston 7 to seal the end portion of the given through holes of the body to produce a ceramic filter 1.

A known method for producing such a mask, utilizes a metal mold having convex portions at the position corresponding to the through holes of a honeycomb structural body, through which a sealing material is injected, and silicone or polyurethane is poured into the metal mold and cured therein (European Patent Laid-Open Specification No. 70,671).

However, a ceramic honeycomb structural body has already been strained or distorted during the forming or firing, and therefore even when the above described mask is elastic and freely deformable, it is difficult to adjust the mask to the opening end surface of all ceramic honeycomb structural bodies. Therefore a large number of metal molds must be produced. Particularly, in a ceramic honeycomb structural body having 5-60 through holes per 1 $cm^2$. It is necessary to produce a metal mold which requires precise working, and the production of the metal mold is not inexpensive.

SUMMARY OF THE INVENTION

The object of the present invention is to eliminate the above described drawbacks.

That is, the feature of the present invention lies in a method of producing a mask to be used for the production of a ceramic filter from a porous ceramic honeycomb structural body, comprising producing an ultraviolet ray-transmitting film which does not transmit ultraviolet rays at the portion corresponding to the through holes of a porous honeycomb structural body, into which holes a sealing material is to be injected at the opening end surface of the body, and furthermore can transmit ultraviolet rays at the portion corresponding to the through holes of the body, into which holes the sealing material is not to be injected at the opening end surface of the body; arranging the film on an ultraviolet ray-curable reins; irradiating the resin with ultraviolet rays through the film; and removing the resin portion, which has not been cured by the ultraviolet rays, from the resin.

BRIEF DESCRIPTION OF THE DRAWINGS

FIG. 1 is a front view of one embodiment of a ceramic filter hereinbefore explained;

FIG. 2 is a side view, partly in section, of the ceramic filter illustrated in FIG. 1;

FIG. 3 is a diagrammatic view for explaining a method of producing a ceramic filter by injecting a sealing material into the through holes of a honeycomb structural body by using a mask, hereinbefore explained;

FIG. 4 is a flow chart for explaining the production steps of a ceramic filter in the present invention;

DESCRIPTION OF THE PREFERRED EMBODIMENT

The present invention will be explained in more detail referring to the flow chart shown in FIG. 4. The first step is to select properly a ceramic honeycomb structural body. The mask of the present invention is directly fitted to a ceramic honeycomb structural body, into which a sealing material is to be injected. Therefore, it is desirable to select a honeycomb structural body which is most representative of the manufacturing lot of the honeycomb structural bodies. The ceramic honeycomb structural body has been extruded and/or fired depending upon the type and manufacturing order of the mask.

The second step is to make an ultraviolet ray-transmitting film. The pattern of one opening end surface of the through holes of a ceramic honeycomb structural body selected in the above described step is firstly recognized. In the recognition of the pattern, photography or a TV camera is used.

When using photography, a negative ultraviolet ray-transmitting film is made, in which the portions corresponding to the through holes to be sealed with a sealing material are not irradiated by ultraviolet rays.

Figure 5:
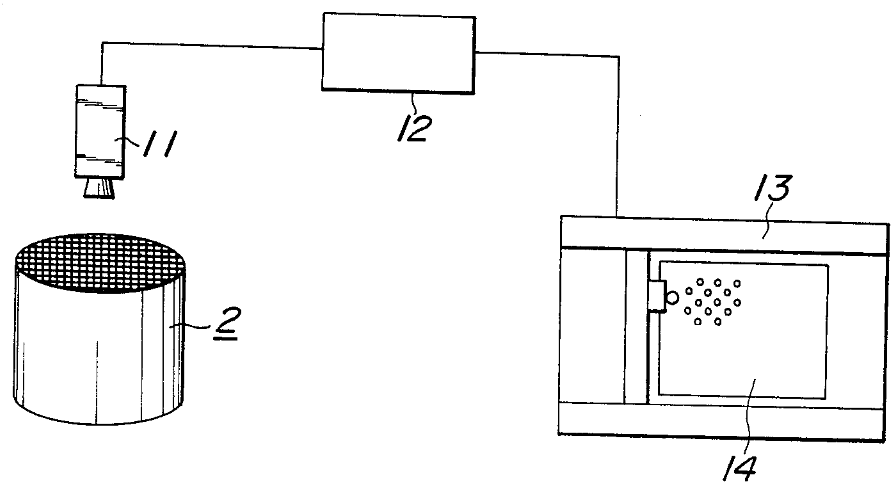
FIG. 5 is a schematic view for explaining how to produce an ultraviolet ray-transmitting film by recognizing the pattern of a ceramic honeycomb structural body by a TV camera in one embodiment of the present invention.

When a TV camera is used, the position of through holes at the opening end surface of a ceramic honeycomb structural body 2 is recognized by a TV camera 11 as illustrated in FIG. 5, the signal is input into a microcomputer 12. The position of through holes to be sealed at the opening end surface of the ceramic honeycomb structural body is determined, and an arrangement drawing 14 indicating the through holes to be injected with a sealing material in a mask is produced by means of an XY plotter 13.

In this arrangement drawing 14, the portions corresponding to the through holes of a mask are fully marked in black color. The shape of the blackened portions is circular, quadranguular, octagonal or the like, according to the shape of the through holes. The dimension of the blackened portions is equal to or less than that of the through holes of a honeycomb structural body. Furthermore, a mask produced based on the arrangement drawing 14 corresponds completely to the through holes of a honeycomb structural body at its opening end surface. Therefore, the arrangement drawing 14 is drawn in the same arrangement as that of the through holes of a honeycomb structural body at its opening end surface. The above obtained arrangement drawing is photographed, and an ultraviolet ray-transmitting film 15 is produced. When the arrangement drawing is a transparent film, the film can be directly used as an ultraviolet ray-transmitting film 15.

The third step is to cure an ultraviolet ray-curable resin, wherein the resin consisting mainly of nylon, polyester, polyurethane, diacrylate or denatured polyvinyl alcohol is formed in a sheet, on which an ultraviolet ray-transmitting film made in the above described step is arranged. Ultraviolet rays are irradiated to the resin through the ray transmitting film to cure the resin.

Figure 6:
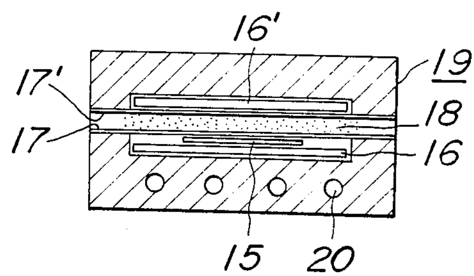
FIG. 6 is a schematic sectional view for explaining the step for irradiating ultraviolet ray in one embodiment of the present invention.

One embodiment of the third step of the present invention will be explained referring to FIG. 6. The ultraviolet ray-transmitting film 15 and a cover film 17 are arranged on an ultraviolet ray-transmitting glass plate 16, and a previously deaired ultraviolet ray-curable resin 18 is extended in a sheet having a uniform thickness on the cover film 17. Then, another cover film 17' and glass plate 16' are arranged on the ultraviolet ray-curable resin sheet 18 to hold the resin sheet 18 between the glass plates 16 and 16' like a sandwich. The sandwich-like assembly is arranged in an irradiation room, which has an ultraviolet ray-irradiating apparatus 19 arranged therein, such that the ultraviolet ray-transmitting film 15 faces toward an ultraviolet ray-irradiating lamp 20. The ultraviolet ray-curable resin 18 is irradiated with ultraviolet rays according to the pattern of the ultraviolet ray-transmitting film 15. Specifically the resin 18 is irradiated with ultraviolet rays at the portion corresponding to the through holes not to be sealed with a sealing material in a honeycomb structural body.

The ultraviolet ray-curable resin to be used in the present invention is properly selected from ultraviolet ray-curable resins hardly adhering with the sealing material and is selected so as to exhibit an appropriate strength according to the size of the ceramic honeycomb structural body to be sealed.

The material of the cover films 17 and 17' is selected so as to transmit ultraviolet rays and not have any affinity with or adhere to the ultraviolet ray-curable resin.

The irradiation time for the ultraviolet rays is determined by various conditions, e.g.; type of the ultraviolet ray-curable resin, the thickness thereof and the irradiation source of ultraviolet rays. However, the time is usually within the range of 1–15 minutes.

The irradiation source for ultraviolet rays is made from a mercury vapor lamp, arc lamp etc. in addition to the above described ultraviolet ray-irradiating lamp.

The fourth step is to etch the ultraviolet ray-curable resin irradiated with ultraviolet rays to make a mask which can be used for the production of a ceramic filter. The ultraviolet ray-curable resin which has not been irradiated with ultraviolet rays is dissolved with an etching liquid. The etching liquid may be water, alkali solution, alcohols etc.; suitable for the ultraviolet ray-curable resin to be used.

In order to carry out effectively the etching of the ultraviolet ray-curable resin and to obtain a precise mask to be used for the production of a ceramic filter, it is effective to use a brush, or to jet an etching liquid upon the irradiated film or to utilize an ultrasonic washing apparatus.

After etching, the ultraviolet ray-curable resin is washed and dried to obtain the mask.

Figure 7:
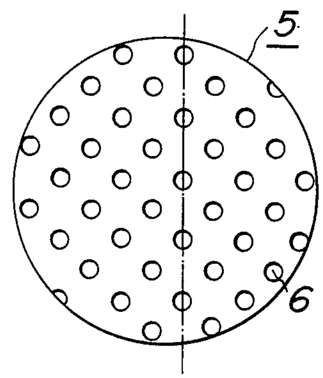
FIG. 7 is a plan view of one embodiment of a mask to be used for the production of a ceramic filter, which mask is obtained by the present invention.
Figure 8:
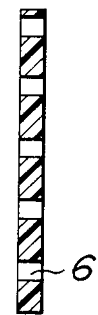
FIG. 8 is a sectional view of the mask illustrated in FIG. 7.

The result is a flat plate-shaped mask 5, which has the same outer shape as that of a ceramic honeycomb structural body and has through holes 6, which are to be injected with a sealing material as illustrated in FIGS. 7 and 8.

Figure 9:
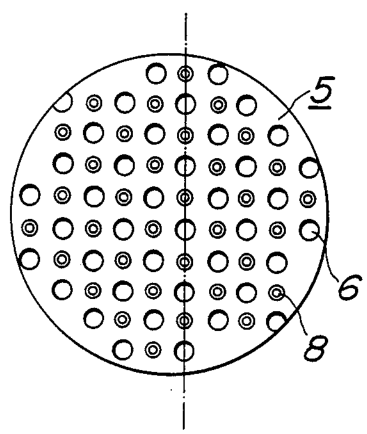
FIG. 9 is a plan view of another embodiment of a mask to be used for the production of a ceramic filter, which mask is obtained by the present invention.
Figure 10:
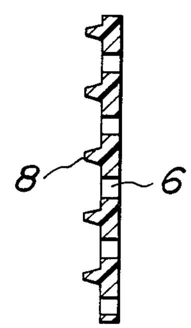
FIG. 10 is a sectional view of the mask illustrated in FIG. 9.

The mask to be used in the production of a ceramic filter, obtained in the present invention, is not limited to a flat plate-shaped mask, but includes a mask 5 illustrated in FIGS. 9 and 10, which has through holes 6 to be injected with a sealing material and has protruding portions 8 which fit into through holes of a ceramic honeycomb structural body to prevent the flowing of the sealing material into the through holes of the honeycomb structural body which are not to be injected with a sealing material.

The mask having protruding portions 8, as illustrated in FIGS. 9 and 10, can be made in the following manner. That is, the second ultraviolet ray-transmitting film 15' corresponding to the protruding portion 8 is additionally produced in the above described second step for making an ultraviolet ray-transmitting film.

In the use of a TV camera for the production of an arrangement drawing used for the production of the mask 5 having the protruding portions 8, the arrangement drawing 14' of through holes not to be sealed is drawn by an XY plotter 13, and an ultraviolet ray-transmitting film 15' is produced based upon the arrangement drawing 14'.

Figure 11:
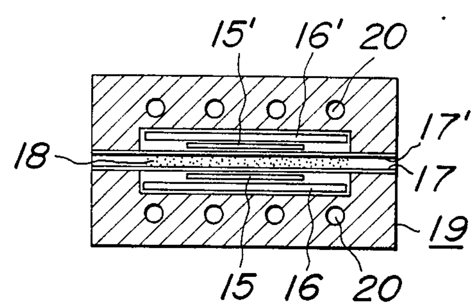
FIG. 11 is a schematic sectional view for explaining the step for irradiating ultraviolet ray in another embodiment of the present invention.

Then, the ultraviolet ray-transmitting film 15' is arranged on an ultraviolet ray-curable resin 18 on the the side opposite to an ultraviolet ray-transmitting film 15, which corresponds to through holes to be injected with a sealing material, as illustrated in FIG. 11. The ultraviolet ray-curable resin 18 is irradiated with ultraviolet rays according to the procedure described in the above described third step and then etched according to the procedure of the fourth step to obtain the mask. The irradiation of ultraviolet rays may concurrently be carried out both sides of the ultraviolet ray-curable resin, or may be firstly carried out on one side and then on the other side of the resin. When ultraviolet rays are irradiated onto the resin, it is important to adjust the positions of the ultraviolet ray-transmitting films 15 and 15', which respectively correspond to through holes 6 to be injected with a sealing material and to protruding portions 8 not to be injected with a sealing material.

It is desirable that the height of the protruding portion 8 of the mask is larger than the depth of the through holes 6 to be injected with a sealing material in a mask. When ultraviolet rays are irradiated onto an ultraviolet ray-curable resin to form the protruding portions 8, the ultraviolet rays are scattered into the resin. As the result, tapered protruding portions are formed by etching, and the tapered protruding portions can be easily fitted to a ceramic honeycomb structural body.

As described above, the mask to be used for the production of a ceramic filter, which mask is obtained according to the present invention, corresponds completely to a ceramic honeycomb structural body to be injected with a sealing material, and therefore the mask matches to the ceramic honeycomb structural body, and can be applied to the production of various ceramic filters. Accordingly, the present invention is very contributive to the industry.

What is claimed is:

1. A method of producing a mask to be used in the production of a ceramic filter from a porous ceramic honeycomb structural body, comprising producing an ultraviolet ray-transmitting film which does not transmit ultraviolet rays through portions corresponding to through holes of a porous ceramic honeycomb structural body which are to be filled with a sealing material, which is injected at opening end surfaces of the body, and the transmitting film can transmit ultraviolet rays through portions corresponding to through holes of the body which are not to be filled with the sealing material which is injected at the opening end surfaces of the body; arranging the film on an ultraviolet ray-curable resin; irradiating the ultraviolet ray-curable resin by passing ultraviolet rays through the transmitting film to the ultraviolet ray-curable resin; and removing all portions of the ultraviolet ray-curable resin which have not been cured by the ultraviolet rays, thereby producing a mask for selectively filling through holes of the honeycomb body with the sealing material.

2. The method according to claim 1, wherein a first ultraviolet ray-transmitting film includes first portions which do not transmit ultraviolet rays, said first portions corresponding to through holes of a porous ceramic honeycomb structural body which are to receive a sealing material and a second ultraviolet ray-transmitting film including second portions which do not transmit ultraviolet rays, said second portions also corresponding to through holes of the body which are to receive the sealing material, said first and second films being separately produced and the first film is arranged on one side of the ultraviolet ray-curable resin and the second film is arranged on a second side of the ultraviolet ray-curable resin and the resin is irradiated by passing ultraviolet rays through the films.

3. The method of claim 1, wherein a picture is taken of the through holes of the ceramic honeycomb structural body, resulting in a negative having exposed portions which do not permit passage of ultraviolet rays therethrough.

4. The method of claim 1, wherein a TV camera monitors positions of the through-holes in the ceramic honeycomb structural body and an output of the TV camera is inputted to a microcomputer which formulates an arrangement drawing by outputting its signal to an XY plotter, the arrangement drawing is then photographed and results in the transmitting film having exposed portions which do not permit the passage of ultraviolet rays therethrough.

5. The method of claim 1, wherein the ultraviolet ray-curable resin which has not been cured by the ultraviolet rays is removed by an etching liquid selected from the group consisting of water, alkali solutions, and alcohols.

6. The method of claim 5, wherein the etching liquid is applied by an apparatus selected from the group consisting of a brush, an etching liquid jet and an ultrasonic washing apparatus.

7. The method of claim 6, wherein after etching, the ultraviolet ray-curable resin is washed and dried.

8. The method of claim 2, wherein irradiation concurrently occurs through each transmitting film.

9. The method of claim 2, wherein irradiation sequentially occurs through each transmitting film.

10. The method of claim 8, wherein said second portions have a greater surface area than said first portions, thereby forming protruding portions on one side of the ultraviolet ray-curable resin.

11. The method of claim 9, wherein said second portions have a greater surface area than said first portions, thereby forming protruding portions on one side of the ultraviolet ray-curable resin.

12. The method of claim 1, wherein a first cover film and the ultraviolet ray-transmitting film are placed on a first ultraviolet ray-transmitting glass plate, such that said first cover film, said ultraviolet ray-transmitting film and said first glass plate are between a first source producing the ultraviolet rays and the ultraviolet ray-curable resin.

13. The method of claim 12, wherein a second cover film and a second glass plate are placed on a side of the ultraviolet ray-curable resin opposite from the first glass plate and the first cover film.

14. The method of claim 13, wherein a second ultraviolet ray transmitting film is placed on the second glass plate and said second cover film, said second ultraviolet ray-transmitting film and said second glass plate are between a second source producing ultraviolet rays on said opposite side of the ultraviolet ray-curable resin.

15. The method of claim 12, wherein the ultraviolet ray-curable resin is arranged directly on said first glass plate.

16. The method of claim 14, wherein the ultraviolet ray-curable resin is sandwiched between said first glass plate and said second glass plate.

17. A method of producing a mask to be used in the production of a ceramic filter from a porous ceramic honeycomb structural body, comprising:

producing an ultraviolet ray-transmitting film which does not transmit ultraviolet rays through portions corresponding to through holes of a porous ceramic honeycomb structural body which are to be filled with a sealing material, which is injected at opening end surfaces of the body, and the transmitting film permits transmission of ultraviolet rays through portions corresponding to through holes of the body which are not to be filled with the sealing material which is injected at the opening end surfaces of the body;

arranging the ultraviolet ray-transmitting film on a first side of a first cover film;

placing an ultraviolet ray curable resin upon a second side of said first cover film;

irradiating the ultraviolet ray-curable resin by passing ultraviolet rays through the transmitting film and the cover film to the ultraviolet ray-curable resin; and removing all portions of the ultraviolet ray-curable resin which have not been cured by the ultraviolet rays, thereby producing a mask for selectively filling through holes of the honeycomb body with the sealing material.

18. A method of producing a mask to be used in the production of a ceramic filter from a porous ceramic honeycomb structural body, comprising producing an ultraviolet ray-transmitting film which does not transmit ultraviolet rays through portions corresponding to through holes of a porous honeycomb structural body which are to be filled with a sealing material, which is injected at opening end surfaces of the body, and the transmitting film permits transmission of ultraviolet rays through portions corresponding to through holes of the body which are not to be filled with the sealing material which is injected at the opening end surfaces of the body;

arranging a first ultraviolet ray-transmitting film on a first side of a first cover film and arranging a second ultraviolet ray-transmitting film on a first side of a second cover film, such that an ultraviolet ray-curable resin is sandwiched between second sides of said first and said second cover films;

irradiating the ultraviolet ray-curable resin by first and second ultraviolet ray-producing sources, such that ultraviolet rays are transmitted to the ultraviolet ray-curable resin through each of said ray-transmitting films and cover films into said sandwiched ultraviolet ray-curable resin; and removing all portions of the ultraviolet ray-curable resin which have not been cured by the ultraviolet rays, thereby producing a mask for selectively filling through holes of the honeycomb body with the sealing material.

19. A method of producing a mask to be used in the production of a ceramic filter from a porous ceramic honeycomb structural body, comprising:

producing an ultraviolet ray-transmitting film which does not transmit ultraviolet rays through portions corresponding to through holes of a porous ceramic honeycomb structural body which are to be filled with a sealing material, which is injected at opening end surfaces of the body, and the transmitting film permits transmission of ultraviolet rays through portions corresponding to through holes of the body which are not to be filled with the sealing material which is injected at the opening end surfaces of the body by taking a picture of the through holes of the ceramic honeycomb strctural body, resulting in a negative having exposed portions which do not permit passage of ultraviolet rays therethrough;

arranging the ultraviolet ray-transmitting film on a first side of a first cover film;

placing an ultraviolet ray curable resin upon a second side of said first cover film;

irradiating the ultraviolet ray-curable resin by passing ultraviolet rays through the transmitting film and the cover film to the ultraviolet ray-curable resin; and removing all portions of the ultraviolet ray-curable resin which have not been cured by the ultraviolet rays, thereby producing a mask for selectively filling through holes of the honeycomb body with the sealing material.

20. A method of producing a mask to be used in the production of a ceramic filter from a porous ceramic honeycomb structural body, comprising:

producing an ultraviolet ray-transmitting film which does not transmit ultraviolet rays through portions corresponding to through holes of a porous ceramic honeycomb structural body which are to be filled with a sealing material, which is injected at opening end surfaces of the body, and the transmitting film permits transmission of ultraviolet rays through portions corresponding to through holes of the body which are not to be filled with the sealing material which is injected at the opening end surfaces of the body by monitoring the through holes of the ceramic honeycomb structural body with a TV camera and an output of the TV camera is inputted into a microcomputer which formulates an arrangement drawing by outputting its signal to an XY plotter, the arrangement drawing is then photographed and results in the transmitting film having exposed portions which do not permit passage of ultraviolet rays therethrough;

arranging the ultraviolet ray-transmitting film on a first side of a first cover film;

placing an ultraviolet ray curable resin upon a second side of said first cover film;

irradiating the ultraviolet ray-curable resin by passing ultraviolet rays through the transmitting film and the cover film to the ultraviolet ray-curable resin; and removing all portions of the ultraviolet ray-curable resin which have not been cured by the ultraviolet rays, thereby producing a mask for selectively filling through holes of the honeycomb body with the sealing material.

* * * * *